(12) United States Patent
Darshan

(10) Patent No.: US 9,608,508 B2
(45) Date of Patent: Mar. 28, 2017

(54) INTEGRATED LIMITER AND ACTIVE FILTER

(71) Applicant: Microsemi P.O.E Ltd., Hod Hasharon (IL)

(72) Inventor: Yair Darshan, Petach Tikva (IL)

(73) Assignee: Microsemi P.O.E Ltd., Hod Hasharon (IL)

( * ) Notice: Subject to any disclaimer, the term of this patent is extended or adjusted under 35 U.S.C. 154(b) by 325 days.

(21) Appl. No.: 14/337,256

(22) Filed: Jul. 22, 2014

(65) Prior Publication Data

US 2015/0028842 A1 Jan. 29, 2015

Related U.S. Application Data

(60) Provisional application No. 61/859,315, filed on Jul. 29, 2013.

(51) Int. Cl.
*H02H 9/08* (2006.01)
*H02M 1/32* (2007.01)
(Continued)

(52) U.S. Cl.
CPC ............ *H02M 1/32* (2013.01); *G05F 1/575* (2013.01); *H02M 3/155* (2013.01); *H03H 11/0405* (2013.01)

(58) Field of Classification Search
CPC ............ H02M 3/155; H02M 11/0405; H03H 11/0405; G05F 1/5735
(Continued)

(56) References Cited

U.S. PATENT DOCUMENTS 5,698,973 A * 12/1997 Goerke ................... G05F 1/468
  323/238
6,201,674 B1 * 3/2001 Warita .................. G05F 1/5735
  323/277
(Continued)

FOREIGN PATENT DOCUMENTS

JP 2011-039578 A 2/2011

OTHER PUBLICATIONS

International Search Report for PCT/IL2014/050667 issued by European Patent Office Dec. 18, 2014.
(Continued)

*Primary Examiner* — Thienvu Tran
*Assistant Examiner* — Lucy Thomas
(74) *Attorney, Agent, or Firm* — Simon Kahn

(57) ABSTRACT

An integrated limiter and active filter constituted of: an input node; an output node; a transistor coupled between the input node and the output node; a first control circuit coupled to the control terminal of the transistor and arranged to limit the amount of current flowing through the output node to a predetermined value which is responsive to a signal received at a first reference input; a second control circuit coupled to the control terminal of the transistor and arranged to limit the voltage appearing at the output node to a predetermined value which is responsive to a signal received at a second reference input; and a third control circuit coupled to input node and arranged to provide the second reference input, the third control circuit arranged to set the second reference input responsive to the input voltage and to a predetermined maximum allowed output voltage.

19 Claims, 2 Drawing Sheets

(51) Int. Cl.
*H02M 3/155* (2006.01)
*H03H 11/04* (2006.01)
*G05F 1/575* (2006.01)
*G05F 3/04* (2006.01)

(58) Field of Classification Search
USPC .......................................................... 323/312
See application file for complete search history.

(56) References Cited

U.S. PATENT DOCUMENTS 7,362,078 B2 * 4/2008 Agari ...................... G05F 1/575
    323/268
2004/0008079 A1   1/2004 Osamura et al.

OTHER PUBLICATIONS

Written Opinion of the International Searching Authority for PCT/IL2014/050667 issued by European Patent Office Dec. 18, 2014.
Huffman, Ettinger and Gater; Ripple Blocker for Power Supply Output Noise Attenuation "Silence is Golden"; downloaded May 28, 2013 from www.micrel.com.
LT4363 Data Sheet, LT 0312 REVA, downloaded May 28, 2013 from www.linear.com.
Siemens PROFET BTS 410 E2 data sheet, dated Mar. 1997, downloaded May 28, 2013 from www.datasheetcatalog.com.

* cited by examiner

INTEGRATED LIMITER AND ACTIVE FILTER

TECHNICAL FIELD

The present invention relates to the field of current control for a load, and in particular to an arrangement that provides a current limiter, load dump protection and integrated active filter.

BACKGROUND OF THE INVENTION

Remote powering, wherein the power supply is located at a distance from the load, and connected over standard cabling, requires attention to particular factors. For simplicity, the power supply will be herein denoted a power sourcing equipment (PSE) and the load to be powered will be a called a powered device (PD). Firstly, detection by the PSE that a compatible PD is connected prior to supplying power is typically desirable. Secondly, limitation of the amount of current that may be drawn from the PSE over the cabling is preferred so as to provide protection for the PSE and for the cabling in event of a short circuit, or near short circuit at the PD side.

In the event of remote powering in an automobile, additional issues include load dump protection and the varying input voltage with ripple. The term load dump protection in an automotive environment is generally understood to mean protection of the load against extreme voltage transients in the event of disconnection of the battery while the alternator is sending out a charging current. In such a case the voltage output by the alternator may rise from a nominal voltage of about 14 V to a voltage in excess of 100 V for up to 500 msec.

Automotive power supply systems may exhibit a varying direct current (DC) output voltage, based on load, engine speed and battery condition. The varying output voltage may further exhibit some ripple voltage, which may be exhibit a very wide frequency spectrum, including low sub-bass frequency components and frequencies in the megahertz plus ranges. In the event that only a single wire pair is utilized for both power and data transfer, filtering of the high frequency ripple is necessary to avoid data interference. Additionally, such an active filter will reduce the demands on any DC/DC converter in the system, thus allowing for reduced cost.

SUMMARY OF THE INVENTION

Accordingly, it is a principal object of the present invention to overcome at least some of the disadvantages of the prior art. This is provided by an integrated arrangement providing current limiting, load dump protecting and active high frequency filtering around a single transistor, particularly a field effect transistor (FET) and more particularly a metal oxide semiconductor FET (MOSFET).

A first control circuit is provided in communication with a current sensor, the first control circuit arranged to control the single transistor so as to govern current flow there through so as not to exceed a predetermined value. A second control circuit is providing in communication with the output node, the second control circuit arranged to control the single transistor so as to limit the voltage appearing at the output node so as not to exceed a reference value. A third control circuit is provided to generate the reference value for the second control circuit. The third control circuit provides a reference value which: may not exceed a predetermined maximum value, thereby providing load dump protection; and is varied in accordance with the average received input voltage so as to reduce power loss across the single transistor.

The present embodiments enable an integrated limiter and active filter comprising: an input node; an output node; a transistor coupled between said input node and said output node; a first control circuit coupled to a control terminal of said transistor, said first control circuit arranged to limit an amount of current flowing through said output node to a first predetermined value, the first predetermined value responsive to a first reference signal; a second control circuit coupled to the control terminal of said transistor, said second control circuit arranged to limit the voltage appearing at said output node to a second predetermined value, the second predetermined value responsive to a second reference signal; and a third control circuit coupled to said input node and arranged to provide said second reference signal, said second reference signal responsive to the input voltage and to a predetermined maximum allowed output voltage.

In one embodiment, said third control circuit is arranged to set said second reference signal to a value equal to the minimum of: the input voltage at said input node determined over a predetermined period plus a predetermined offset; and a predetermined maximum value. In another embodiment the first reference signal is a ramped signal during a startup phase of the integrated limiter and active filter.

In one embodiment the integrated limiter and active filter further comprises a coupling and bias network, an output of said coupling and bias network coupled to a control terminal of said transistor, said coupling and bias network arranged to couple the output of each of first control circuit and said second control circuit to the control terminal of the transistor. In one further embodiment said coupling and bias network is further arranged to bias said transistor to be on when voltage at said input node is greater than voltage at said output node. In another further embodiment said first control circuit comprises a first differential amplifier arranged to compare a representation of the amount of current with the first reference signal, the output of said first differential amplifier coupled to said control terminal of said transistor via said coupling and bias network. In yet another further embodiment said second control circuit comprises a second differential amplifier arranged to compare a representation of the voltage at said output node with the second reference signal, the output of said second differential amplifier coupled to said control terminal of said transistor via said coupling and bias network.

Independently the present embodiments enable a method of providing an integrated active filtering and current limiting for electrical power provided via a transistor, the method comprising: comparing a representation of an amount of current flow through the transistor with a first reference signal; comparing a representation of an output voltage associated with the transistor with a second reference signal; and controlling the transistor responsive to said comparison with the first reference signal and said comparison with the second reference signal such that said current flow representation does not exceed said first reference signal and said output voltage representation does not exceed said second reference signal.

In one embodiment the method further comprises providing the second reference signal responsive to the input voltage and to a predetermined maximum allowed output voltage so as to provide ripple rejection. In another embodiment the method further comprises providing the second reference signal responsive to the input voltage determined over a predetermined period plus a predetermined offset and a predetermined maximum value.

In one embodiment the method further comprises providing the first reference signal as a ramped signal during a startup phase. In another embodiment the method further comprises biasing said transistor to be on when voltage at said input node is greater than voltage at said output node.

Independently the present embodiments enable an integrated limiter and active filter comprising: an input node; an output node; a transistor coupled between said input node and said output node; a first control means coupled to a control terminal of said transistor, said first control means arranged to limit an amount of current flowing through said output node to a first predetermined value, the first predetermined value responsive to a first reference signal; a second control means coupled to the control terminal of said transistor, said second control means arranged to limit the voltage appearing at said output node to a second predetermined value, the second predetermined value responsive to a second reference signal; and a third control means coupled to said input node and arranged to provide said second reference signal, said second reference signal responsive to the input voltage and to a predetermined maximum allowed output voltage.

In one embodiment, said third control means is arranged to set said second reference signal to a value equal to the minimum of: the input voltage at said input node determined over a predetermined period plus a predetermined offset; and a predetermined maximum value. In another embodiment the first reference signal is a ramped signal during a startup phase of the integrated limiter and active filter.

In one embodiment the integrated limiter and active filter further comprises a coupling and bias network, an output of said coupling and bias network coupled to a control terminal of said transistor, said coupling and bias network arranged to couple the output of each of first control means and said second control means to the control terminal of the transistor. In one further embodiment said coupling and bias network is further arranged to bias said transistor to be on when voltage at said input node is greater than voltage at said output node. In another further embodiment said first control means comprises a first differential amplifier arranged to compare a representation of the amount of current with the first reference signal, the output of said first differential amplifier coupled to said control terminal of said transistor via said coupling and bias network. In yet another further embodiment said second control means comprises a second differential amplifier arranged to compare a representation of the voltage at said output node with the second reference signal, the output of said second differential amplifier coupled to said control terminal of said transistor via said coupling and bias network.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawing.

DETAILED DESCRIPTION OF PREFERRED EMBODIMENTS

Figure 1:
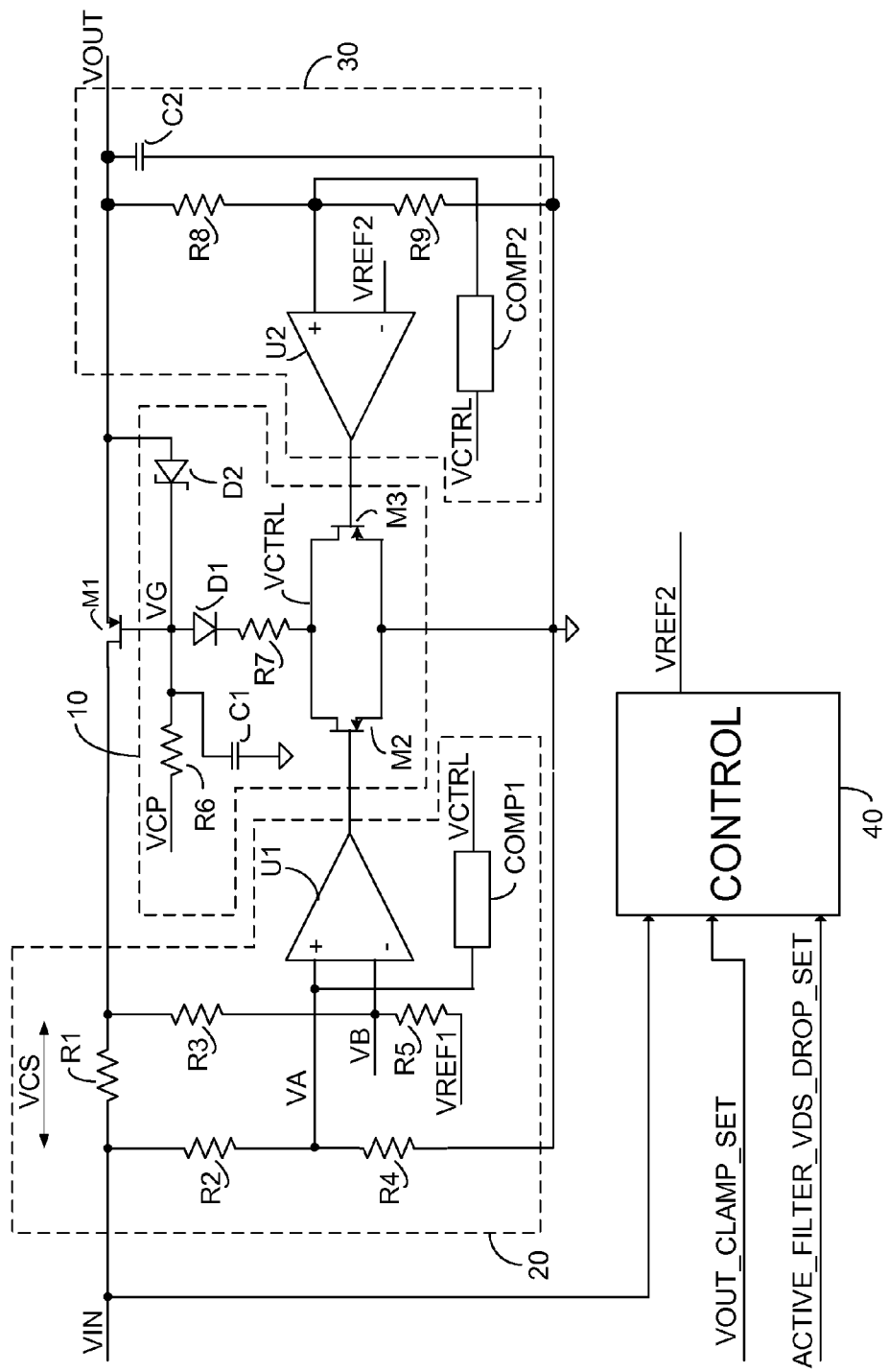
FIG. 1 illustrates a high level schematic diagram of an exemplary integrated limiter and active filter.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level schematic diagram of an exemplary integrated limiter and active filter comprising a transistor M1; a coupling and bias network 10; a first control circuit 20; a second control circuit 30 and a third control circuit 40. Coupling and bias network 10 comprises: a bias voltage input lead, coupled to a bias voltage VCP; a resistor R6; a capacitor C1; a diode D1; a resistor R7; a breakdown diode D2; and a first and a second transistor M2 and M3, illustrated without limitation as NMOSFETs. First control circuit 20 comprises: a sense resistor R1; a plurality of resistors R2, R3, R4 and R5; a differential amplifier U1; and an optional compensation network COMP1. Second control circuit 30 comprises: a resistor R8; a resistor R9; a capacitor C2; a differential amplifier U2; and an optional compensation network COMP2. Third control circuit 40 preferably comprises an A/D converter internal thereto, and is arranged to receive a maximum reference voltage level, denoted VOUT_CLAMP_SET; and an offset voltage level, denoted: ACTIVE_FILTER_VDS_DROP_SET. A reference voltage is provided, denoted VREF1, which may be internally generated, or externally provided.

An input node, denoted VIN, is arranged to receive an input electrical power. Input node VIN is coupled to a first end of sense resistor R1, resistor R2 and to the input of third control circuit 40. A second end of resistor R2 is coupled to a first end of resistor R4, to the non-inverting input of differential amplifier U1 and to a first end of optional compensation network COMP1, and is denoted voltage VA. A second end of resistor R4 is coupled to a common potential. A second end of sense resistor R1 is coupled to a first end of resistor R3 and to the drain of transistor M1. A second end of resistor R3 is coupled to the inverting input of differential amplifier U1, and via resistor R5 to a reference source denoted VREF1. The voltage at the non-inverting input of differential amplifier U1 is denoted voltage VB.

The gate of transistor M1 is coupled to the anode of diode D1, to a first end of resistor R6, to a first end of capacitor C1 and to the cathode of breakdown diode D1, and is denoted voltage VG. A second end of resistor R6 is coupled to a bias voltage VCP and a second end of capacitor C1 is coupled to the common potential. The cathode of diode D1 is coupled via resistor R7 to the drains of each of transistors M2 and M3, the voltage at the drains of transistors M2, M3 denoted VCTRL. The sources of transistors M2 and M3 are coupled to the common potential. The gate of transistor M2 is coupled to the output of differential amplifier U1 and the gate of transistor M3 is coupled to the output of differential amplifier U2.

The source of transistor M1 is coupled to the anode of breakdown diode D2, to a first end of resistor R8 and to a first end of capacitor C2, and is denoted VOUT, i.e. the output node. A second end of resistor R8 is coupled to the non-inverting input of differential amplifier U2, to a first end of optional compensating network COMP2, and via resistor R9 to the common potential. A second end of capacitor C2 is coupled to the common potential. The output of control circuit 40, denoted VREF2, is coupled to the inverting input of differential amplifier U2.

In operation, first control circuit 20 governs the amount of current flowing out of output node VOUT so that it does not exceed a predetermined value. Current flowing from the input node towards the output node passes through sense resistor R1, and produces a voltage drop there through, denoted VCS. Bias voltage VCP is set to a voltage higher than VIN, so as to allow M1 to be turned on.

The voltage across sense resistor R1 is measured by the resistor network comprising resistors: R2, R3, R4 and R5 which forms a differential measurement network. In a preferred embodiment R2=R3=R4=R5, the common value of which is denoted R. As a result U1 senses across its input terminals a voltage which is correlated to the current through R1, which as indicated above is also the input and output current of M1. R1 is illustrated at the input side of M1, however this is not meant to be limiting in any way, and in an alternative embodiment R1 is arranged between the source of transistor M1 and the output note VOUT, without exceeding the scope.

VREF1 is coupled to the inverting input of U1 via R5, and thus sets the maximum current through transistor M1, denoted IOUT_MAX, as:

$$\text{IOUT\_MAX}=(\text{VREF1}/R1)*(1/K-1) \quad \text{EQ. 1}$$

where K is:

$$K=R4/(R2+R4)=R5/(R3+R5) \quad \text{EQ. 2}$$

Differential amplifier U1 controls the drain voltage of M2, which results in control of the gate voltage VG of transistor M1. As long as VCS is reflective of a condition wherein the current through the output node is less than IOUT_MAX, the voltage at the inverting input of U1 is higher than the voltage at the non-inverting input of U1, which results that the output of U1 output is driven low, or close to the common potential, which drives transistor M2 off. If transistor M2 is off, the gate of transistor M1 is biased to voltage VCP, and transistor M1 is thus driven on.

As VCS increases towards a voltage reflective of IOUT_MAX, differential amplifier U1 turns on transistor M2, which thus modulates gate voltage VG to prevent VCS from rising to reflect a voltage in excess of IOUT_MAX. Steady state is achieved when voltage VA is approximately equal to voltage VB. Optional compensation network COMP1 is provided to provide loop stability. The above has been described in an embodiment wherein U1 is utilized to control M1 so as to act as a current limiter when the voltage drop across VCS is indicative that the current through M1 approaches IOUT_MAX, however this is not meant to be limiting. In an alternate embodiment M1 is set to open when the current though M1 approaches IOUT_MAX, by latching U1 for a predetermined period responsive to an output of third control circuit 40 (not shown). In such an embodiment compensation network COMP1 is not required.

D1 functions to prevent VOUT from becoming negative when VIN is connected to a negative voltage by blocking conduction of the body diodes of transistors M2 and M3, which body diodes are forward biased in the event that VIN is connected to a negative potential as compared to the common potential. The reverse voltage path through the body diode of transistor M1 is preferably handled by a reverse protection circuit (not shown); the values of R8 and R9 may be selected so as to cooperate with such a reverse protection circuit. R7 is arranged to limit the current through transistors M2, M3 when they are on. D2 is arranged to protect the VGS of transistor M1 from over voltage between VCP and Vout. D1 and D2 are optional, and may not always be required. In normal operation VCP is greater than VIN, preferably by a predetermined value sufficient to ensure complete turn on of transistor M1. In an exemplary embodiment, VCP is set to be 6-10 volts above VIN. In one embodiment VCP is generated via a charge pump device coupled to VIN via a diode. Preferably, the charge pump device is arranged such that in the event that VIN is reverse biased, the charge pump device does not allow for a negative voltage greater than a predetermined value, in relation to the common potential, to appear at VOUT.

Second control circuit 30 provides load dump protection via transistor M1. The control loop for differential amplifier U2 is ORed with the control loop of differential amplifier U1 by coupling and bias network 10 to provide dual control of transistor M1.

When VOUT*R9/(R9+R8) is about VREF2 the voltage loop of U2 and transistor M3 in cooperation with transistor M1 limits VOUT so that VOUT does not exceed the value set by VREF2. C2 is the output capacitor for VOUT.

R6 and C1 form a low pass filter so that in the event that VIN changes rapidly, which is followed by VCP, VG remains almost constant. VOUT is set by VG and as long as VG remains unchanged VOUT remains unchanged, irrespective of the change in VIN. Constraining VG to change slowly via the low pass filter of R6 and C1 ensures that rapid changes in VIN, faster than the response time of control circuitry 30, are not passed to VOUT. Similarly, overshoot in the event of a large spike in VIN is avoided, and control circuitry 30 ensures that VOUT does not exceed the value set by VREF2.

VCP is preferably set to be greater than the maximum VIN plus the minimum required VGS for transistor M1 to be on. Transistor M1 is illustrates as an NMOS transistor, however a PMOS transistor may be implemented, with appropriate circuit elements and polarity without exceeding the scope.

In one embodiment, VREF1 is slope controlled during startup so as to ensure a soft start for VOUT. Adding an initial slope to VREF1 ensures that the current output at node VOUT slowly ramps up during startup, when a large capacitive load may appear across output node, thus preventing large inrush current.

Control circuit 40 adjusts VREF2 to provide active filtering. In particular, the adjustment of VREF2 functions to set VOUT to be below the minimum value of VIN for ripple rejection while maintaining the minimal, or near minimal, required voltage drop across M1 so as to reduce power dissipation. The minimum value of VIN is described below, but is not meant to include values so low as to prevent proper operation of ultimate load circuitry. Control circuitry is in one embodiment provided with an A/D converter. VIN is sampled, and control circuitry 40 determines the minimum value of VIN, denoted VIN_MIN, preferably after filtering out any noise. In one non-limiting embodiment, VIN_MIN is determined responsive to a determination of the average voltage and the peak to peak ripple voltage.

Control circuitry 40 functions to generate VREF2 to a value that will set Vout to be ≤VIN_MIN by setting VOUT to:

$$VOUT=VIN\_MIN-VDS\_MIN \qquad EQ.\ 3$$

where VDS_MIN is a minimum safety margin to ensure that all ripple is rejected. Setting VOUT in accordance with EQ. 3 ensures that any ripple voltage on VIN is rejected by M1 and is not seen at VOUT. Additionally, setting VOUT in accordance with EQ. 3 minimized the power loss across transistor M1, since VOUT is set as close as practical to VIN_MIN so as to block any ripple from appearing at VOUT.

Parameters of VOUT can preferably be overridden by the user. In one embodiment, as illustrated, a value may be provided by a user at input ACTIVE_FILTER_VDS_DROP_SET of third control circuitry 40. In the event that a value is presented at input ACTIVE_FILTER_VDS_DROP_SET of third control circuitry 40, third control circuitry 40 is arranged to determine the average voltage of VIN, denoted VIN_AVG, and set VOUT via VREF2 to be:

$$VOUT=VIN\_AVG-ACTIVE\_FILTER\_VDS\_DROP\_SET$$

Alternately, third control circuitry 40 may be arranged to set VOUT to:

$$VOUT=VIN\_MIN-ACTIVE\_FILTER\_VDS\_DROP\_SET$$

Third control circuitry 40 optionally additionally exhibits an input denoted VOUT_CLAMP_SET. This is a priority setting for VOUT and determines the maximum amount of VOUT that may be allowed by the setting of VREF2. Thus, VOUT_CLAMP_SET represents the output of VOUT in the event of load dump.

EXAMPLE 1

Assuming VIN_AVG=14V and VIN_MIN=12.8V, then:

$$ti\ VIN\_AVG-VIN\_MIN=1.2V$$

Assuming that there is equal ripple above and below VIN_AVG, 1.2V represents ½ the peak to peak ripple voltage. Adding a 10% safety margin to the lower ripple, i.e. adding 10% to VIN_AVG−VIN_MIN, sets VDS_MIN at 0.12V. Thus, VOUT will be automatically set to 12.68V in accordance with EQ. 3, by third control circuitry 40 setting the value of VREF2 accordingly. In particular, control circuitry 40 sets the value of VREF2 in accordance with:

$$VREF2=12.68V*R9/(R9+R8)$$

EXAMPLE 2

Assuming VIN_AVG=14V and VIN_MIN=12.8V, and that a value is set at input ACTIVE_FILTER_VDS_DROP_SET, and this is defined as the maximum peak ripple value. Utilizing a 10% margin for components tolerance and safety, $$VDS\_MIN=1.1*ACTIVE\_FILTER\_VDS\_DROP\_SET.$$

Third control circuitry 40 thus sets VREF2 in accordance with:

$$VREF2=(14V-(1.1*ACTIVE\_FILTER\_VDS\_DROP\_SET))*R9/(R9+R8)$$

This results in rejection of ripple on VIN of up to twice ACTIVE_FILTER_VDS_DROP_SET.

EXAMPLE 3

Assuming VOUT_CLAMP_SET is set to 20V, then the maximum value allowed for VREF2, denoted VREF2 (MAX) is:

$$VREF2(MAX)=20*R9/(R9+R8)$$

In the event that VIN rises to above 20V, irrespective of EQ. 3, VREF2 is constrained to VREF2_MAX and VOUT is limited to 20V. Transients during the rise of VIN to well above 20V are prevented due to the low pass filter of R6, C1 as described above, which thus also prevents overshoot.

Figure 2:
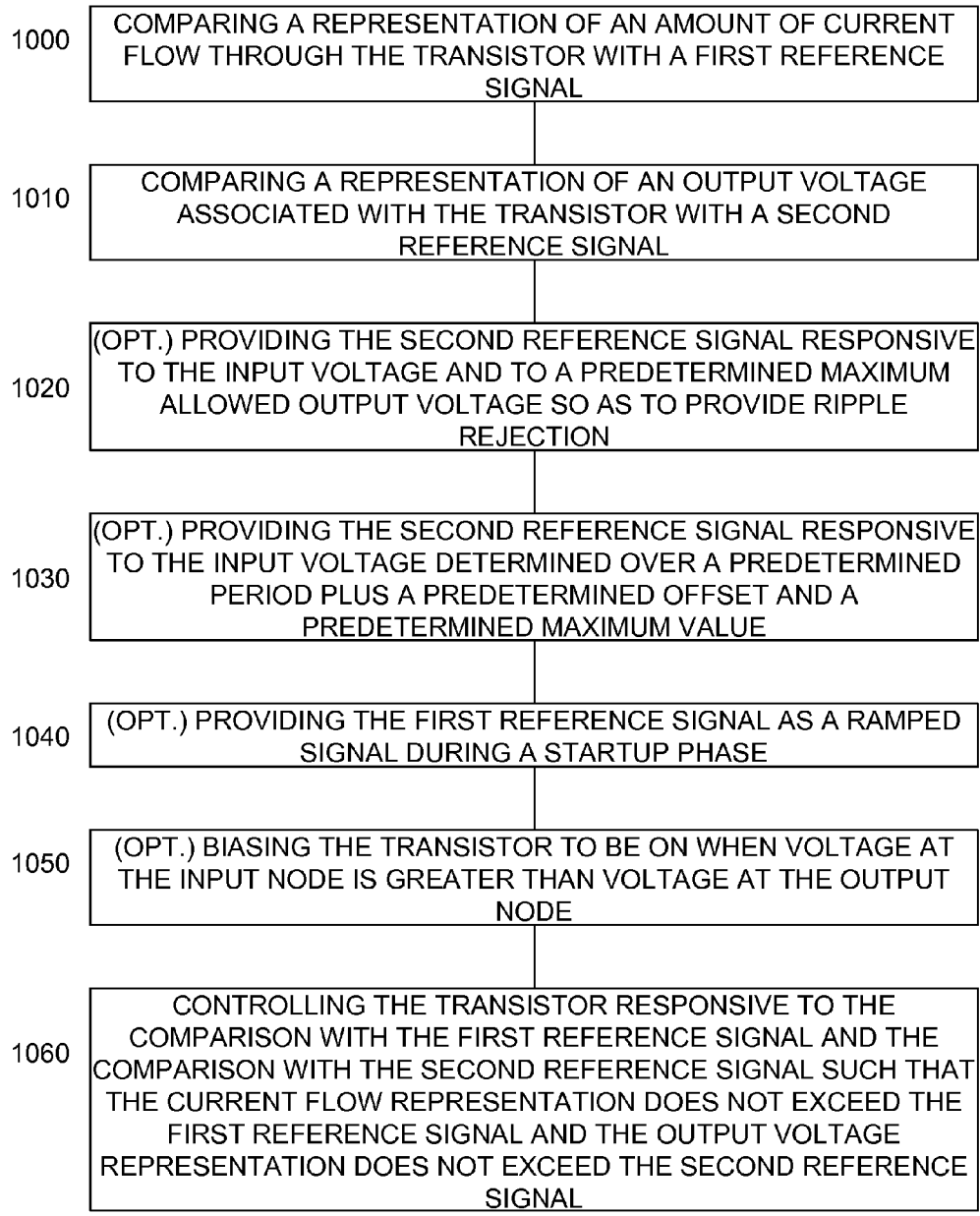
FIG. 2 illustrates an exemplary method of providing an integrated active filtering and current limiting.

FIG. 2 illustrates an exemplary method of providing an integrated active filtering and current limiting. In stage 1000, a transistor is provided in a current path, and a representation of an amount of current flow through the transistor is compared with a first reference signal. In stage 1010, a representation of the output voltage associated with the transistor is compared with a second reference signal.

In optional stage 1020 the second reference signal is provided responsive to the input voltage and to a predetermined maximum output voltage so as to provide ripple rejection, as described above in relation to EQ. 3 and third control circuitry 40. In optional stage 1030 the second reference signal is provided responsive to: the input voltage determined over a predetermined time period plus a predetermined offset; and a predetermined maximum value, as described above in relation to EQ. 3 and third control circuitry 40.

In optional stage 1040 the first reference signal is provided as a ramped signal during a startup phase, as described above in relation to VREF1. In optional stage 1050, the transistor of stage 1000 is biased to be in an on-state when voltage at the input node associated with the transistor is greater than voltage at the output node associated with the transistor.

In stage 1050, the transistor of stage 1000 is controlled responsive to the comparison with the first reference signal of stage 1000 and the comparison with the second reference signal of stage 1010 such that the current flow representation does not exceed the first reference signal and the output voltage representation does not exceed the second reference signal.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

It will be appreciated by persons skilled in the art that the present invention is not limited to what has been particularly shown and described herein above. Rather the scope of the present invention is defined by the appended claims and includes both combinations and sub-combinations of the various features described hereinabove as well as variations and modifications thereof which would occur to persons skilled in the art upon reading the foregoing description and which are not in the prior art.

The invention claimed is:

1. An integrated limiter and active filter comprising:
an input node;
an output node;
a transistor coupled between said input node and said output node;
a first control circuit coupled to a control terminal of said transistor, said first control circuit arranged to limit an amount of current flowing through said output node to a first predetermined value, the first predetermined value responsive to a first reference signal;
a second control circuit coupled to the control terminal of said transistor, said second control circuit arranged to limit the voltage appearing at said output node to a second predetermined value, the second predetermined value responsive to a second reference signal; and
a third control circuit coupled to said input node and arranged to provide said second reference signal, said third control circuit arranged to set said second reference signal to a value equal to the minimum of:
a function of the input voltage at said input node, said input voltage determined over a predetermined period, plus a predetermined offset; and
a predetermined maximum value.

2. The integrated limiter and active filter of claim 1, wherein said function is one of an average and a minimum.

3. The integrated limiter and active filter of claim 1, wherein the first reference signal is a ramped signal during a startup phase of the integrated limiter and active filter.

4. The integrated limiter and active filter of claim 1, further comprising a coupling and bias network, an output of said coupling and bias network coupled to a control terminal of said transistor, said coupling and bias network arranged to couple the output of each of first control circuit and said second control circuit to the control terminal of the transistor.

5. The integrated limiter and active filter of claim 4, wherein said coupling and bias network is further arranged to bias said transistor to be on when voltage at said input node is greater than voltage at said output node.

6. The integrated limiter and active filter of claim 4, wherein said first control circuit comprises a first differential amplifier arranged to compare a representation of the amount of current with the first reference signal, the output of said first differential amplifier coupled to said control terminal of said transistor via said coupling and bias network.

7. The integrated limiter and active filter of claim 4, wherein said second control circuit comprises a second differential amplifier arranged to compare a representation of the voltage at said output node with the second reference signal, the output of said second differential amplifier coupled to said control terminal of said transistor via said coupling and bias network.

8. A method of providing an integrated active filtering and current limiting for electrical power provided via a transistor, the method comprising:
comparing a representation of an amount of current flow through the transistor with a first reference signal;
providing a second reference signal responsive to an input voltage and to a predetermined maximum allowed output voltage, said provided second reference signal set to the minimum of:
a function of the value of the input voltage, said value determined over a predetermined period, plus a predetermined offset; and
a predetermined maximum value,
comparing a representation of an output voltage associated with the transistor with said provided second reference signal; and
controlling the transistor responsive to said comparison with the first reference signal and said comparison with the second reference signal such that said current flow representation does not exceed said first reference signal and said output voltage representation does not exceed said second reference signal.

9. The method according to claim 8, wherein said function is a minimum.

10. The method according to claim 8, wherein said function is an average.

11. The method according claim 8, further comprising providing the first reference signal as a ramped signal during a startup phase.

12. The method according to claim 8, further comprising biasing said transistor to be on when voltage at said input node is greater than voltage at said output node.

13. An integrated limiter and active filter comprising:
an input node;
an output node;
a transistor coupled between said input node and said output node;
a first control means coupled to a control terminal of said transistor, said first control means arranged to limit an amount of current flowing through said output node to a first predetermined value, the first predetermined value responsive to a first reference signal;
a second control means coupled to the control terminal of said transistor, said second control means arranged to limit the voltage appearing at said output node to a second predetermined value, the second predetermined value responsive to a second reference signal; and
a third control means coupled to said input node and arranged to provide said second reference signal,
said third control means arranged to set said second reference signal to a value equal to the minimum of:
a function of the input voltage at said input node, said input voltage determined over a predetermined period, plus a predetermined offset; and
a predetermined maximum value.

14. The integrated limiter and active filter of claim 13, wherein said function is one of an average and a minimum.

15. The integrated limiter and active filter of claim 13, wherein the first reference signal is a ramped signal during a startup phase of the integrated limiter and active filter.

16. The integrated limiter and active filter of claim 13, further comprising a coupling and bias network, an output of said coupling and bias network coupled to a control terminal of said transistor, said coupling and bias network arranged to couple the output of each of first control means and said second control means to the control terminal of the transistor.

17. The integrated limiter and active filter of claim 16, wherein said coupling and bias network is further arranged to bias said transistor to be on when voltage at said input node is greater than voltage at said output node.

18. The integrated limiter and active filter of claim 16, wherein said first control means comprises a first differential amplifier arranged to compare a representation of the amount of current with the first reference signal, the output of said first differential amplifier coupled to said control terminal of said transistor via said coupling and bias network.

19. The integrated limiter and active filter of claim 16, wherein said second control means comprises a second differential amplifier arranged to compare a representation of the voltage at said output node with the second reference signal, the output of said second differential amplifier coupled to said control terminal of said transistor via said coupling and bias network.

* * * * *